United States Patent
Ahn (12)

(10) Patent No.: US 6,342,451 B1
(45) Date of Patent: Jan. 29, 2002

(54) METHOD OF FABRICATING FLOATING GATES IN SEMICONDUCTOR DEVICE

(75) Inventor: Dong-ho Ahn, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/558,683

(22) Filed: Apr. 24, 2000

(30) Foreign Application Priority Data

Apr. 22, 1999 (KR) .............................. 99-14489

(51) Int. Cl.⁷ ............................................ H01L 21/302
(52) U.S. Cl. ...................... 438/706; 438/723; 438/724
(58) Field of Search ................................ 438/256, 257, 438/689, 690, 691, 692, 693, 706, 710, 723, 724

(56) References Cited

U.S. PATENT DOCUMENTS

| | | | | |
|---|---|---|---|---|
| 5,290,723 A | * | 3/1994 | Tani et al. ...................... | 437/43 |
| 5,330,924 A | * | 7/1994 | Huang et al. .................. | 437/43 |
| 5,376,227 A | * | 12/1994 | Lee ............................. | 156/643 |
| 5,643,813 A | * | 7/1997 | Acocella et al. ............... | 437/43 |
| 5,688,705 A | * | 11/1997 | Bergemont .................... | 437/43 |
| 5,960,285 A | * | 9/1999 | Hong ........................... | 438/264 |
| 6,204,122 B1 | * | 3/2001 | Joo et al. ...................... | 438/257 |

OTHER PUBLICATIONS

H. Shirai et al., "A 0.5 um2 Self–Aligned, HSG Floating Gate Cell (SAHF Cell) for 256Mbit Flash Memories", 1995 IEEE, pp. 27.1.1–27.1.4.

S. Satoh et al., "A Novel Isolation–Scaling Technology for NAND EEPROM's with the Minimized Program Disturbance", 1997 IEEE, pp. 11.6.1–11.6.4.

\* cited by examiner

Primary Examiner—Benjamin L. Utech
Assistant Examiner—Kin-Chan Chen
(74) Attorney, Agent, or Firm—Marger Johnson & McCllom, P.C.

(57) ABSTRACT

A method of forming floating gates having a high capacitance is provided. In this method, a tunnel oxide layer, a polycrystalline silicon layer, an interlayer oxide layer, and a silicon nitride layer are sequentially formed on a semiconductor substrate having isolation regions in the non-active region. A plurality of silicon nitride layer patterns which are separated from each other by predetermined distances, is formed by etching the silicon nitride layer. The surface of the polycrystalline silicon layer is exposed by etching the interlayer oxide layer using the silicon nitride layer patterns as an etch mask, thereby forming a plurality of interlayer oxide layer patterns. Sidewall spacers are formed on the sidewalls of the silicon nitride layer patterns and the interlayer oxide layer patterns. A mask is formed on the exposed surface of the polycrystalline silicon layer. The silicon nitride layer patterns and the sidewall spacers are removed. The isolation regions are exposed by etching the polycrystalline silicon layer using the interlayer oxide layer patterns and the mask layer as an etch mask.

20 Claims, 8 Drawing Sheets

METHOD OF FABRICATING FLOATING GATES IN SEMICONDUCTOR DEVICE

BACKGROUND OF THE INVENTION

1. Field of the Invention

The present invention relates to a method of fabricating a non-volatile memory device, and more particularly, to a method of fabricating a floating gate having a high capacitance.

2. Description of the Related Art

In volatile semiconductor memory devices, stored data is lost when the supply of power is stopped. On the other hand, in non-volatile semiconductor memory devices, stored data is not lost even if the supply of power is stopped. Recently, flash memories, a type of non-volatile memory, are being widely used as storage devices for products such as personal computers or still cameras. A non-volatile memory device can semi-permanently store desired information by applying a voltage to a control gate, trapping electrons from a semiconductor substrate, and storing the trapped electrons in a floating gate. A high coupling ratio is required for such a non-volatile memory device. The coupling ratio is determined by the ability to store charge in a floating gate, that is, by a capacitance. In order to increase the capacitance induced between the control gate and the floating gate, there have been proposed methods of (1) forming a dielectric film of an ONO structure on the floating gate, (2) forming hemispherical grains on the surface of the floating gate, and (3) enlarging the surface of the floating gate as much as possible. When the method (3) is used, decreasing the spacing between adjacent floating gates to within a predetermined range is significantly restricted due to limits of current photolithographic techniques.

In FIG. 1, which shows the layout of a floating gate pattern in a conventional non-volatile memory device, reference numeral 100 denotes an active region, and reference numeral 110 denotes a floating gate pattern on the active region 100. The spacing or gap between floating gate patterns is indicated by reference character (a) shown in FIG. 2.

In FIG. 2, which shows the cross sectional view of the non-volatile memory device taken along line A–A', of FIG. 1, isolation regions 202 are formed on a semiconductor substrate 200. Floating gates 210 are formed on predetermined areas of the semiconductor substrate 200. Referring to FIG. 2, it becomes evident that a method of increasing the width (b) of a floating gate to enlarge the surface of the floating gate is restricted by the spacing (a) between adjacent floating gates.

A method of forming a gate electrode which is used to reduce the spacing between floating gates in a conventional non-volatile memory device, will now be described with reference to FIGS. 3A through 3E.

Referring to FIG. 3A, a tunnel oxide layer 320, a first polycrystalline silicon layer 330, a silicon nitride layer 340, and a second polycrystalline silicon layer 350 are sequentially formed on the surface of a semiconductor substrate 300 having isolation regions 310 formed therein.

Referring to FIG. 3B, the silicon nitride layer 340 and the second polycrystalline silicon layer 350 are etched by photolithography, thereby forming silicon nitride layer patterns 342 and second polycrystalline silicon layer patterns 352. A silicon nitride layer is deposited on the entire surface of the resultant structure, and then anisotropically etched, thereby forming sidewall spacers 360 on the sidewalls of the silicon nitride layer patterns 342 and the second polycrystalline silicon layer patterns 352.

Referring to FIGS. 3C and 3D, which show forming floating gates, the first polycrystalline silicon layer 330 and the second polycrystalline layer pattern 352 are etched using the sidewall spacers 360 as a mask. Consequently, the surfaces of the isolation regions 310 are exposed, so that the first polycrystalline silicon layer 330 is patterned. Also, the second polycrystalline silicon layer patterns 352 are removed. Next, the silicon nitride layer patterns 342 and the sidewall spacers 360 are removed using phosphoric acid, thereby completing the formation of the floating gates 332. Reference character (a) of FIG. 3D denotes the spacing between adjacent floating gates 332. In the above, when the silicon nitride layer patterns 342 and the sidewall spacers 360 are removed using phosphoric acid, a portion of the floating gates 332, which is exposed to the phosphoric acid used as an etching solution, may be damaged.

Referring to FIG. 3E showing a step of forming a dielectric layer and a control gate, first, a dielectric layer 370 is formed on the semiconductor substrate 300 on which the floating gates 332 have been formed. A conductive material is deposited on the dielectric layer 370, and then patterned, thereby forming a control gate 380.

When a gate electrode is formed by the above-described method, the spacing between floating gates is restricted by limits of a photolithographic process for forming floating gate patterns. Thus, a method of forming a floating gate having an enlarged surface to increase a capacitance is strongly affected by the limits of the photolithographic process. That is, when floating gate patterns are formed by photolithography, light diffraction or the like makes it difficult to form floating gate patterns which are narrowly spaced apart from each other.

In order to solve this problem, U.S. Pat. No. 5,376,227 discloses a multilevel resist process. In this method, finer patterns can be formed by etching using multilevel resist patterns during photolithography. However, this method is very complicated since multilevel resist layers must be formed. Also, it is still difficult to form floating gates having a spacing of 0.1 $\mu$m or less therebetween using this method.

SUMMARY OF THE INVENTION

The present invention provides a method of forming an floating gate having an enlarged surface by minimizing the spacing between floating gates by overcoming the limitations of photolithography.

Also, the present invention provides a method of forming a floating gate without damage to the floating gate.

According to an embodiment of the present invention, in a method of fabricating floating gates in a semiconductor device, first, a tunnel oxide layer, a polycrystalline silicon layer, an interlayer oxide layer, and a silicon nitride layer are sequentially formed on a semiconductor substrate having isolation regions. A plurality of silicon nitride layer patterns, which are separated from each other by predetermined distances, are formed by etching the silicon nitride layer. The surface of the polycrystalline silicon layer is exposed by etching the interlayer oxide layer using the silicon nitride layer patterns as an etch mask, thereby forming a plurality of interlayer oxide layer patterns. Sidewall spacers are formed on the sidewalls of the silicon nitride layer patterns and the interlayer oxide layer patterns. A mask layer is formed on a region of the exposed surface of the polycrystalline silicon layer. The silicon nitride layer patterns and the sidewall spacers are removed. The isolation regions are exposed by etching the polycrystalline silicon layer using the interlayer oxide layer patterns and the mask layer as an etch mask.

Preferably, the widths of the silicon nitride layer patterns are the same as the widths of the floating gates, and the spacing between adjacent silicon nitride layer patterns is greater than the width of a silicon nitride layer pattern. Also, preferably, the spacing between adjacent floating gates is determined by the width of the sidewall spacer. It is preferable that the spacing between adjacent floating gates is 0.1 μm or less. Preferably, the mask layer is a thermal oxide layer formed by thermally oxidizing the region of the exposed surface of the polycrystalline silicon layer. Forming the sidewalls comprises forming a silicon nitride layer on the semiconductor substrate on which the silicon nitride layer patterns have been formed, and anisotropically etching the silicon nitride layer. It is preferable that the silicon nitride layer is formed to a thickness that is the same as the width of each of the sidewall spacers intended to be formed.

According to another embodiment of the present invention, in a method of fabricating floating gates in a semiconductor device, first, a tunnel oxide layer, a first polycrystalline silicon layer, a lower oxide layer, a second polycrystalline silicon layer, an upper oxide layer, and a silicon nitride layer are sequentially formed on a semiconductor substrate having isolation regions. A plurality of silicon nitride layer patterns, which are separated from each other by predetermined distances, are formed by etching the silicon nitride layer. The first surface of the second polycrystalline silicon layer is exposed by etching the upper oxide layer using the silicon nitride layer patterns as an etch mask. A plurality of upper oxide layer patterns are formed. Sidewall spacers are formed on the sidewalls of the silicon nitride layer patterns and the upper oxide layer patterns. A mask layer is formed on the lower oxide layer by thermally oxidizing a region of the first exposed surface of the second polycrystalline silicon layer. The silicon nitride layer patterns and the sidewall spacers are removed. The second exposed surface of the second polycrystalline silicon layer is etched, using the mask layer and the upper oxide layer patterns as an etch mark thereby exposing a surface of the lower oxide layer. Lower oxide layer patterns are formed by etching the mask layer, the upper oxide layer patterns, and the exposed surface of the lower oxide layer. The second polycrystalline silicon layer is removed. The surfaces of the isolation regions are exposed by etching the first polycrystalline silicon layer using the lower oxide layer patterns as an etch mask. The lower oxide layer patterns are removed.

Preferably, the widths of the silicon nitride layer patterns are the same as the widths of the floating gates, and the spacing between adjacent silicon nitride layer patterns is greater than the width of the silicon nitride layer pattern. Also, it is preferable that the spacing between adjacent floating gates is determined by the width of each of the sidewall spacers.

In accordance with still another embodiment of the present invention, in a method of fabricating floating gates in a semiconductor device, first, a tunnel oxide layer, a polycrystalline silicon layer, an interlayer oxide layer, and a silicon nitride layer are sequentially formed on a semiconductor substrate having isolation regions. A plurality of silicon nitride layer patterns, which are separated from each other by predetermined distances, are formed by etching the silicon nitride layer. The surface of the polycrystalline silicon layer is exposed by etching the interlayer oxide layer using the silicon nitride layer patterns as an etch mask, thereby forming a plurality of interlayer oxide layer patterns.

Sidewall spacers are formed on the sidewalls of the silicon nitride layer patterns and the interlayer oxide layer patterns. A mask layer is formed on the entire surface of the resultant structure. The mask layer is planarized so that the silicon nitride layer patterns are at least partially removed and the sidewall spacers are exposed. The silicon nitride layer patterns and the sidewall spacers are removed. The isolation regions are exposed by etching the polycrystalline silicon layer using the interlayer oxide layer patterns and the mask layer as an etch mask.

Preferably, the widths of the silicon nitride layer patterns are the same as the widths of the floating gates, and the spacing between adjacent silicon nitride layer patterns is greater than the width of the silicon nitride layer pattern. Also, it is preferable that the spacing between adjacent floating gates is substantially equal to the width of each of the sidewall spacers. Preferably, the mask layer is an oxide layer formed by chemical vapor deposition (CVD).

According to the present invention, the spacing between floating gates is determined by the width of a sidewall spacer, so that fine floating gate patterns can be formed at narrower spacings overcoming the limits of photolithography. Also, the surfaces of floating gates are not exposed to an etching solution containing phosphoric acid or the like, such that damage to the surfaces of the floating gates is prevented to thus reduce current leakage.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Figure 1:
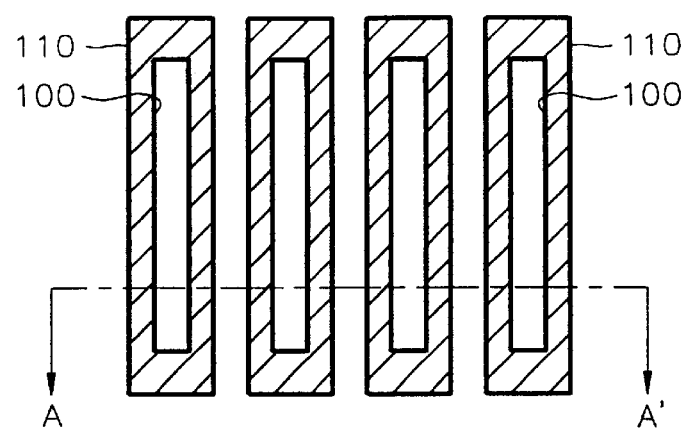
FIG. 1 is a layout view illustrating floating gate patterns in a conventional non-volatile memory device.
Figure 2:
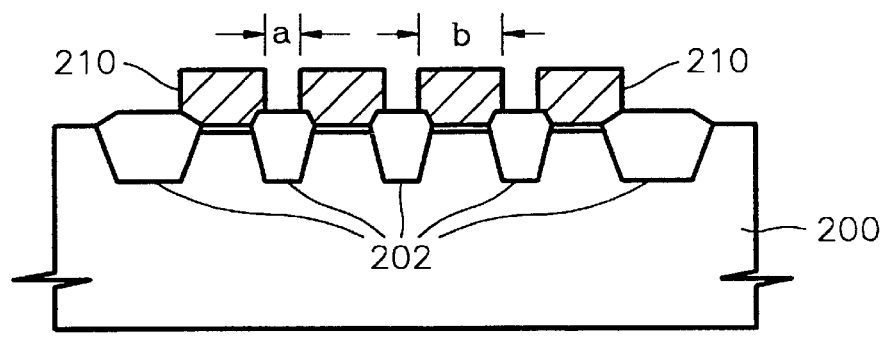
FIG. 2 is a cross-sectional view taken along line A–A' of FIG. 1.
Figure 3A:
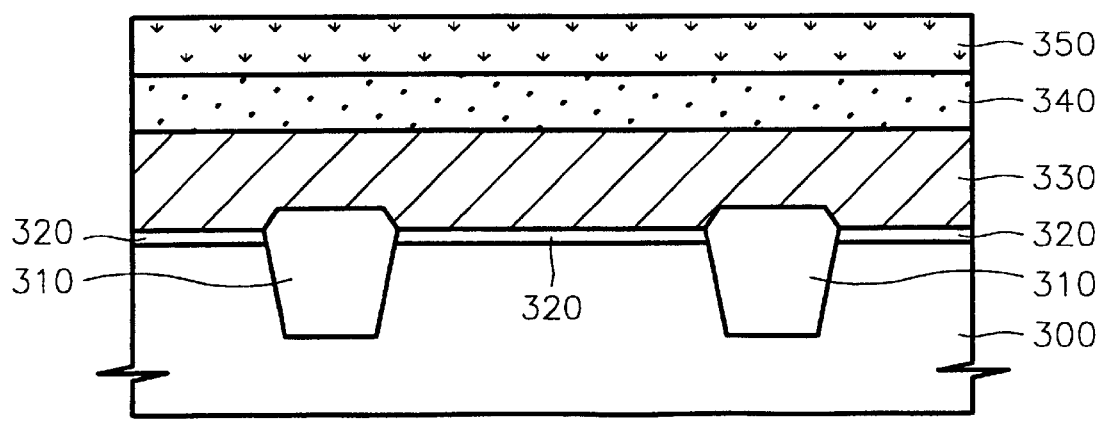
FIGS. 3A through 3E are cross-sectional views sequentially illustrating a conventional method of forming a floating gate in a non-volatile memory device.
Figure 3B:
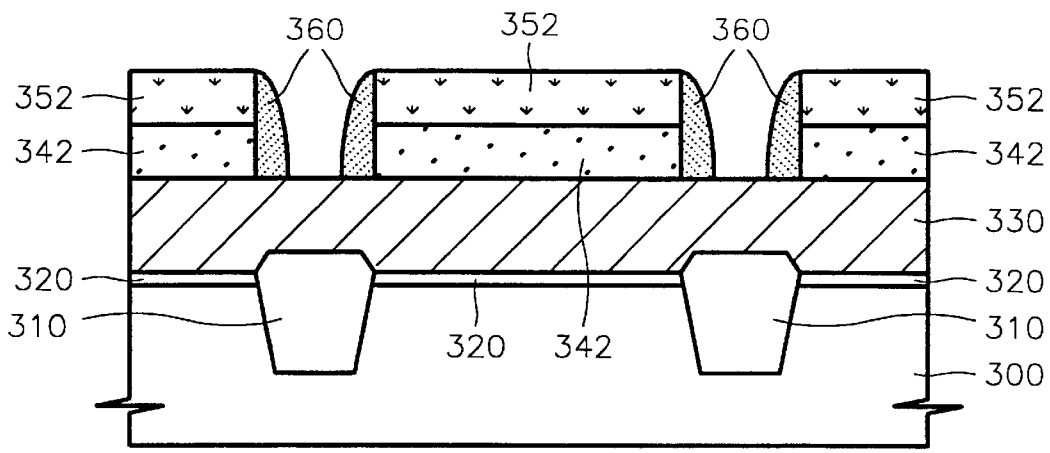
Figure 3C:
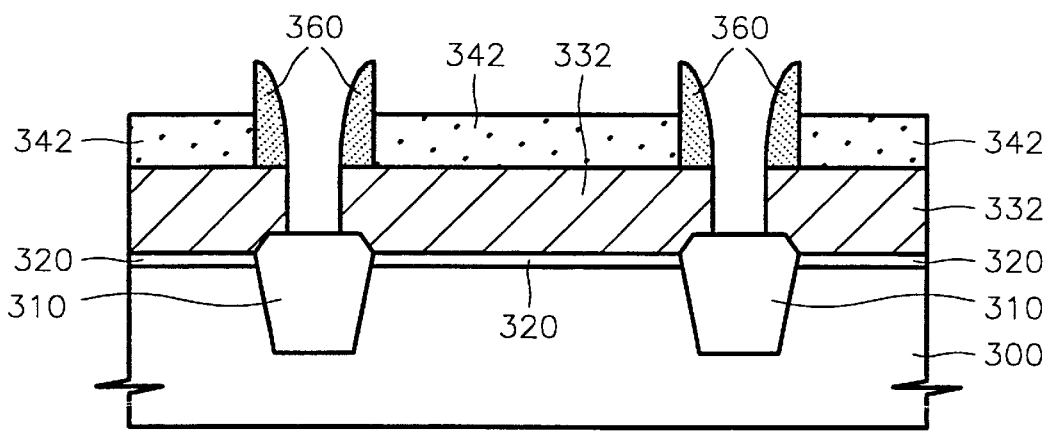
Figure 3D:
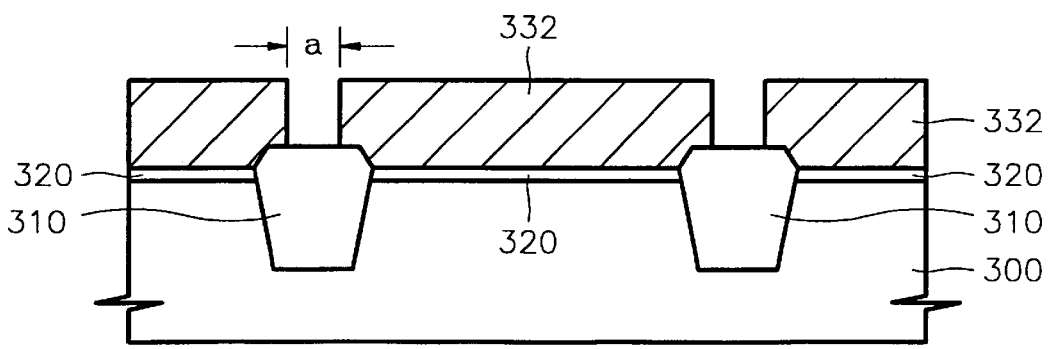
Figure 3E:
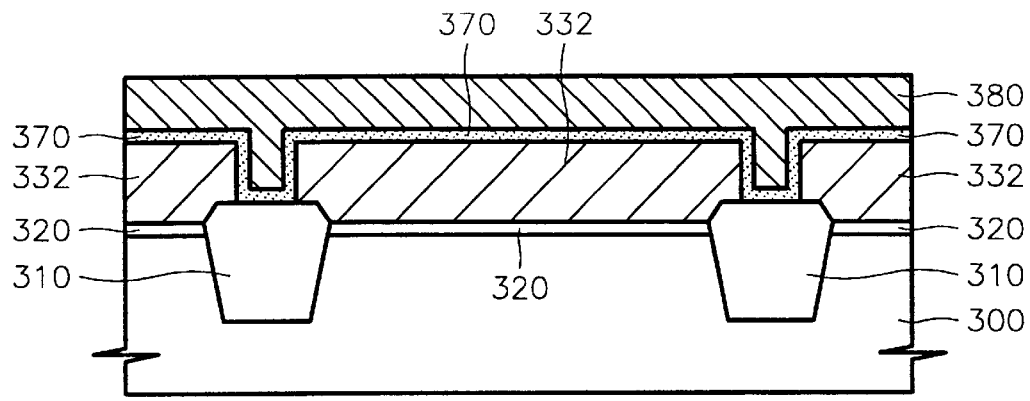

Hereinafter, embodiments of the present invention will be described in detail with reference to the attached drawings. In drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

<First Embodiment>

Figure 4A:
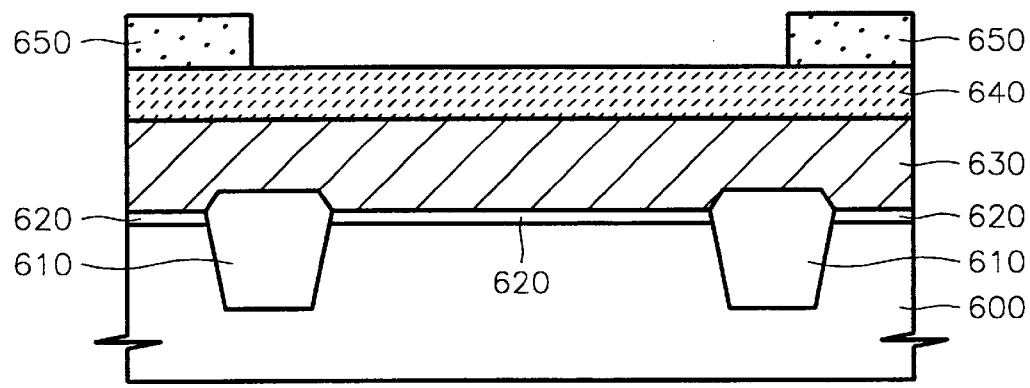
FIGS. 4A through 4E are cross-sectional views sequentially illustrating a method of forming a floating gate in a non-volatile memory device according to a first embodiment of the present invention.

A floating gate forming method according to a first embodiment of the present invention will now be described in detail with reference to FIGS. 4A through 4E. Referring to FIG. 4A, isolation regions 610 are formed in a non-active area of a semiconductor substrate 600 by local oxidation of silicon or trench isolation, e.g. shallow trench isolation (STI). A tunnel oxide layer 620 of about 90 Å in thickness is formed on the entire surface of the semiconductor substrate 600 having isolation regions 610 formed therein. A polycrystalline silicon layer 630, an interlayer oxide layer 640, and a first silicon nitride layer are sequentially formed on the resultant structure. Here, the polycrystalline silicon layer 630 is formed to a thickness of 1000 A, and the interlayer oxide layer 640 can be formed by CVD or thermal oxidation, to a thickness of 50 to 300 A. The first silicon nitride layer is formed to a thickness of 500 to 2000 Å.

The first silicon nitride layer is etched to form a plurality of silicon nitride layer patterns 650 which are spaced apart from each other by predetermined distances. Here, the widths of the silicon nitride layer patterns 650 determine the widths of floating gates (reference numeral 632 of FIG. 4D) to be formed in a subsequent process. Thus, it is preferable that the silicon nitride layer pattern 650 is formed to have a width that is the same as the width of the floating gate. Also, preferably, the spacing between adjacent silicon nitride layer patterns 650 is greater than the width of a silicon nitride layer pattern 650.

Figure 4B:
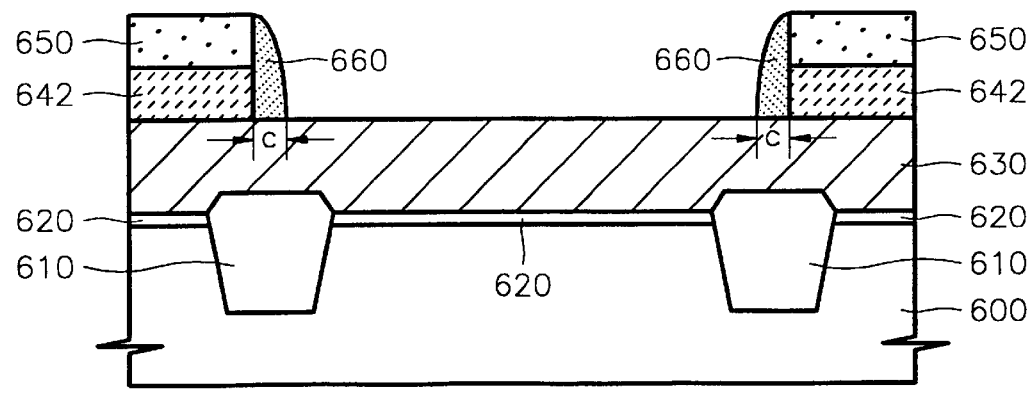

Referring to FIG. 4B, the interlayer oxide layer 640 is etched using the silicon nitride layer patterns 650 as a mask, whereby the surface of the polycrystalline silicon layer 630 is exposed, and interlayer oxide layer patterns 642 are formed. A second silicon nitride layer is formed on the entire surface of the semiconductor substrate 600 on which the surface of the polycrystalline silicon layer 630 is exposed, and then anisotropically etched, resulting in sidewall spacers 660 at the sidewalls of the silicon nitride layer patterns 650 and the interlayer oxide layer patterns 642. Preferably, the second silicon nitride layer is formed to have a thickness of 100 to 1000 Å. The width (c) of the sidewall spacer 660 is determined by the thickness of the second silicon nitride layer, and the width (c) of the sidewall spacer 660 determines the spacing between floating gates (reference numeral 632 of FIG. 4E) which are formed in a subsequent process.

Figure 4C:
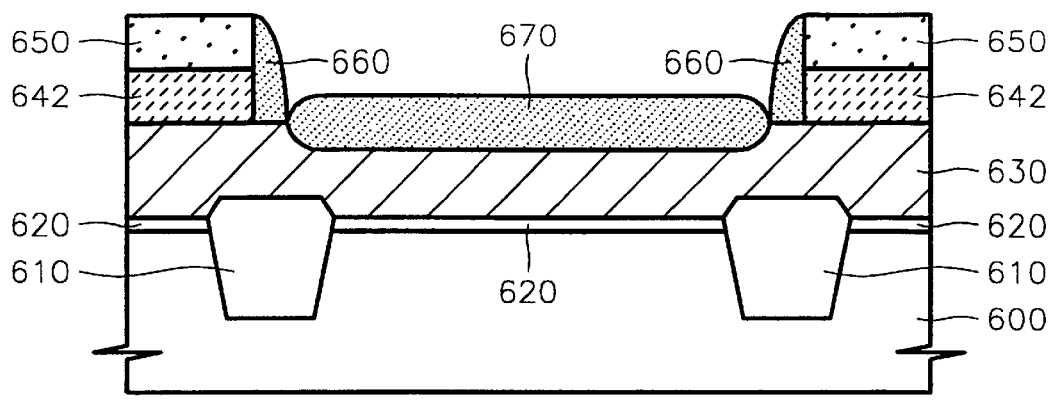

Referring to FIG. 4C, a mask layer 670 is formed on the surface of the exposed portion of the polycrystalline silicon layer 630. It is preferable that the mask layer 670 is a thermal oxide layer formed by thermally oxidizing a region of the exposed surface of the polycrystalline silicon layer 630. Thus, the mask layer 670 cannot be formed on unexposed areas of the polycrystalline silicon layer 630 on which the silicon nitride layer patterns 650 and the sidewall spacers 660 have been formed. Also, it is preferable that the mask layer 670 is formed to have a thickness of 50 to 300 A.

Figure 4D:
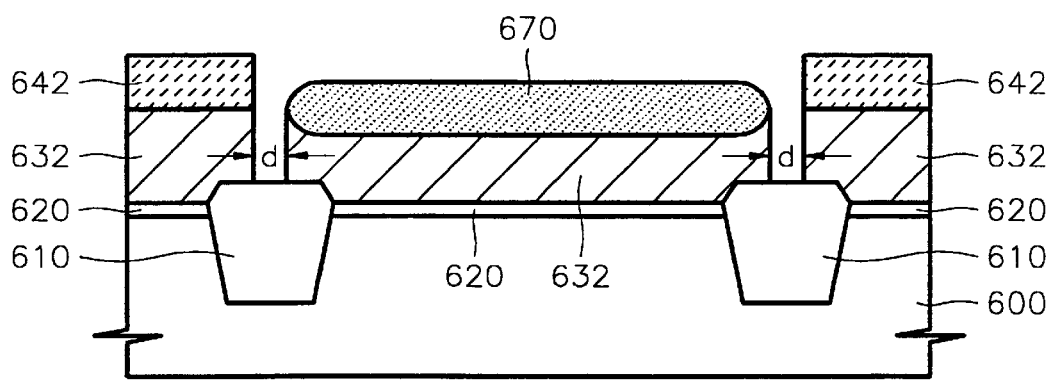

Referring to FIG. 4D, first, the silicon nitride layer patterns 650 and the sidewall spacers 660 are removed to form floating gates 632. It is preferable that the silicon nitride layer patterns 650 and the sidewall spacers 660 are wet etched using an etching solution containing phosphoric acid. Next, the exposed portion of the polycrystalline silicon layer 630 is etched using the interlayer oxide layer patterns 642 and the mask layer 670 as an etch mask. Consequently, the surfaces of the isolation regions 610 are exposed, and the polycrystalline silicon layer 630 is then patterned. The interlayer oxide layer pattern 642 and the mask layer 670 are removed to form floating gates 632. The spacing (d) between adjacent floating gates 632 is determined by the width (reference numeral c of FIG. 4B) of each of the sidewall spacers 660. When floating gates are formed by a conventional method, formation of the spacing between floating gates to 0.1 μm or less is difficult due to the limits of photolithography. However, in the present invention, the spacing between floating gates is determined by the width of the sidewall spacers 660, so that the spacing therebetween can be narrowed to about 100 Å. Thus, the present invention can increase the surface area of the floating gates.

Figure 4E:
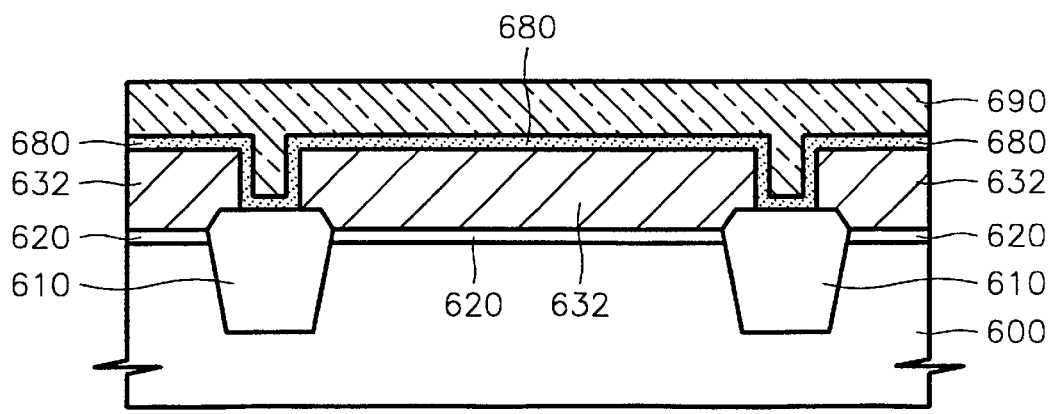

Referring to FIG. 4E, a dielectric layer 680 is formed on the entire surface of the semiconductor substrate 600 on which the floating gates 632 have been formed. Here, it is preferable that the dielectric layer 680 has an ONO structure where an oxide layer, a nitride layer and an oxide layer are stacked one on another. Next, a conductive material is deposited on the dielectric layer 680, and then patterned, thereby forming a control gate 690.

In the present invention, the spacing between floating gates is determined by the width of each of the sidewall spacers 660, so that floating gate patterns having a narrow spacing therebetween can be formed. Thus, wider floating gates can be formed with improved capacitance characteristics.

<Second Embodiment>A second embodiment of the present invention will now described with reference to FIGS. 5A through 5F. Contents that are the same as those of the first embodiment will not be described here.

Figure 5A:
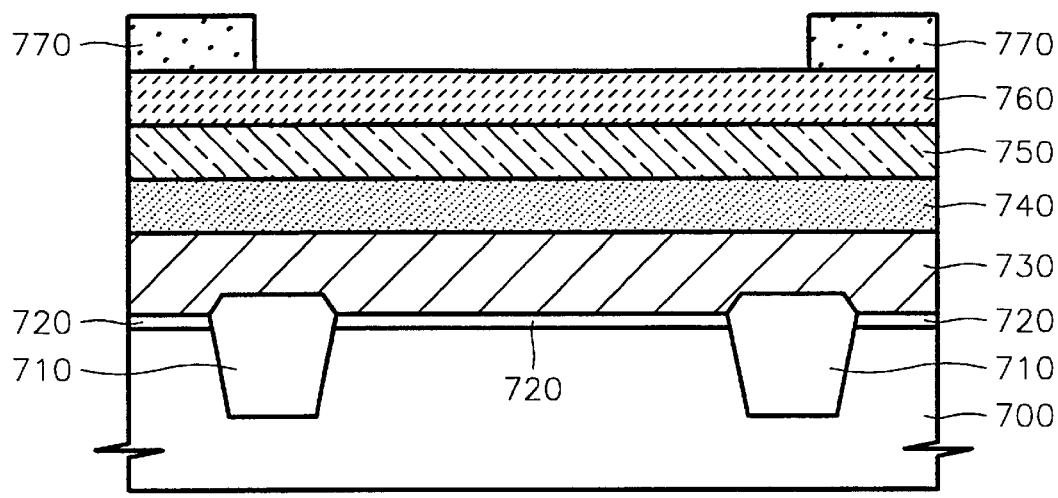
FIGS. 5A through 5F are cross-sectional views sequentially illustrating a method of forming a floating gate in a non-volatile memory device according to a second embodiment of the present invention.

Referring to FIG. 5A, isolation regions 710 are formed in a non-active area of a semiconductor substrate 700. A tunnel oxide layer 720, a first polycrystalline silicon layer 730, a lower oxide layer 740, a second polycrystalline silicon layer 750, an upper oxide layer 760, and a silicon nitride layer are sequentially formed on the entire surface of the semiconductor substrate 700. The silicon nitride layer is etched to form a plurality of silicon nitride layer patterns 770 which are spaced apart from each other by predetermined distances where floating gates are to be formed. Here, the width of each of the silicon nitride layer patterns 770 and the spacing between adjacent silicon nitride layer patterns 770 are determined in the same way as in the first embodiment.

Figure 5B:
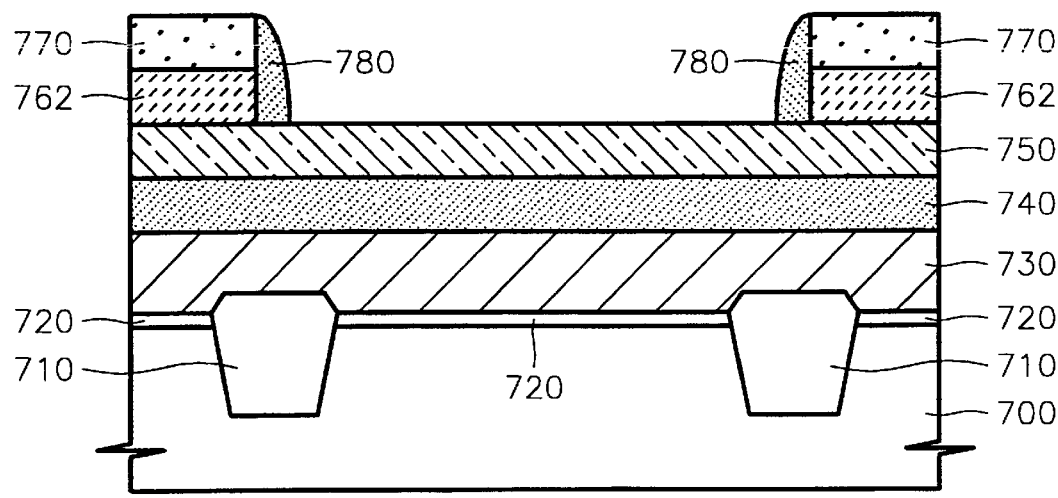

Referring to FIG. 5B, the upper oxide layer 760 is etched using the silicon nitride layer patterns 770 as an etch mask. As a result, the surface of the second polycrystalline silicon layer 750 is exposed, and upper oxide layer patterns 762 are formed. Then, sidewall spacers 780 are formed in the sidewalls of the silicon nitride layer patterns 770 and the upper oxide layer patterns 762.

Figure 5C:
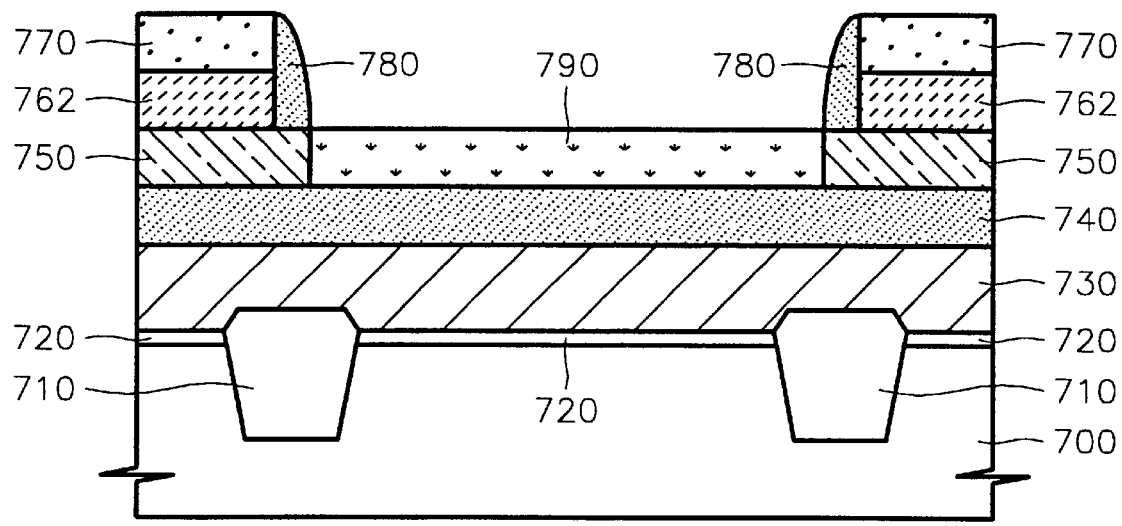

Referring to FIG. 5C, a mask layer 790 is formed by thermally oxidizing the exposed surface of the second polycrystalline silicon layer 750.

Figure 5D:
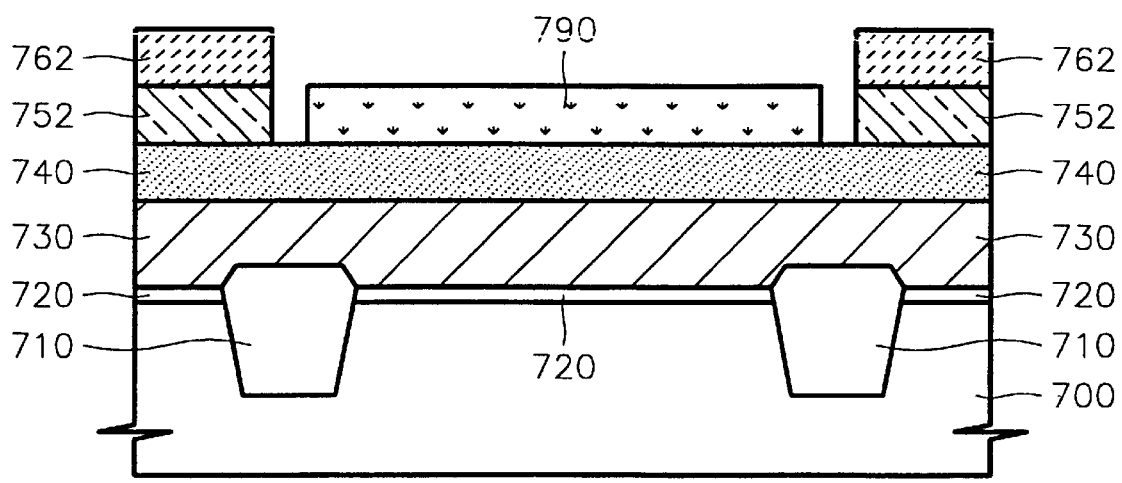

Referring to FIG. 5D, the silicon nitride layer patterns 770 and the sidewall spacers 780 are removed. Next, the exposed portion of the second polycrystalline silicon layer 750 is etched using the upper oxide layer patterns 762 and the mask layer 790 as an etch mask. Consequently, the surface of the lower oxide layer 740 is exposed, and second polycrystalline silicon layer patterns 752 are formed.

Figure 5E:
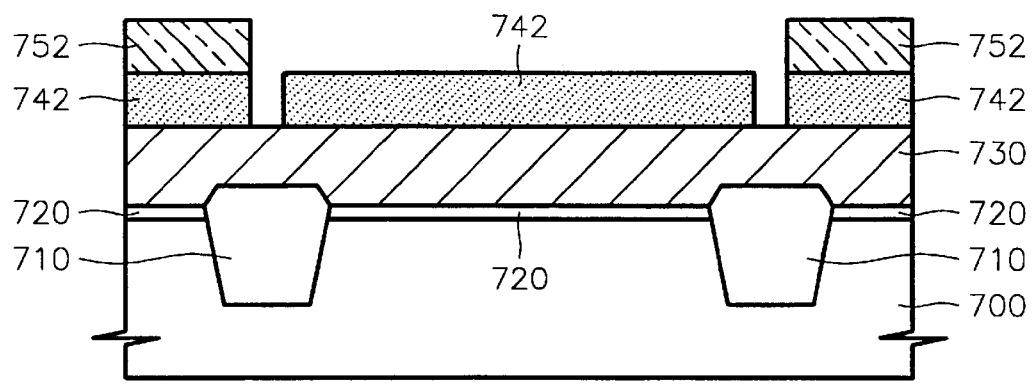

Referring to FIG. 5E, the upper oxide layer patterns 762, the mask layer 790, and an exposed portion of the lower oxide layer 740 are etched. As a result, the surface of the first polycrystalline silicon layer 730 is exposed and lower oxide layer patterns 742 are formed. Then, the second polycrystalline silicon layer patterns 752 are removed.

Figure 5F:
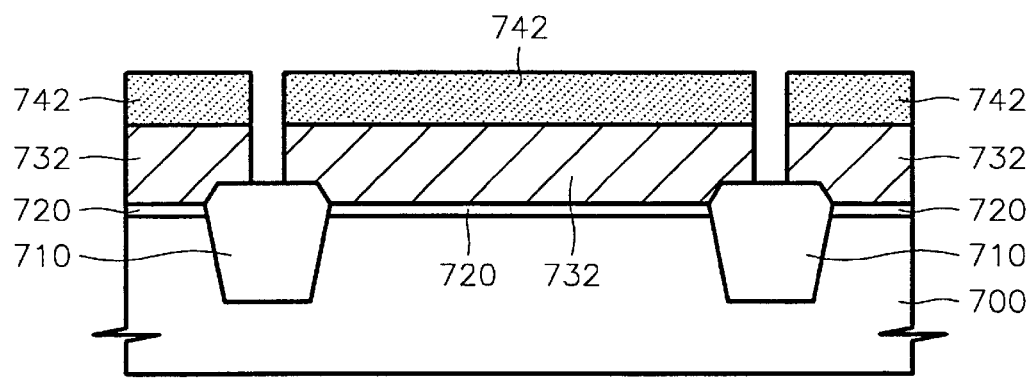

Referring to FIG. 5F, the first polycrystalline silicon layer 730 is etched using the lower oxide layer patterns 742 as an etch mask. As a result, the first polycrystalline silicon layer 730 is patterned and the surfaces of the isolation regions 710 are exposed. Next, the lower oxide layer patterns 742 are removed to form floating gates 732. The subsequent process is the same as that of the first embodiment.

In the second embodiment, portions of the first polycrystalline silicon layer 730, which become the floating gates 732, are not subjected to thermal oxidation. Thus, the floating gates 732 having a flat surface are formed.

<Third Embodiment>

A third embodiment of the present invention will now be described with reference to FIGS. 6A through 6D. Contents that are the same as those of the first embodiment will not be described here.

Figure 6A:
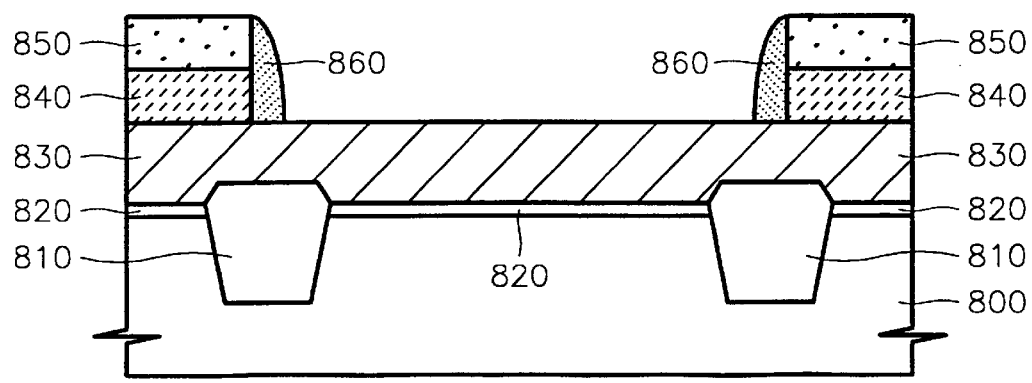
FIGS. 6A through 6D are cross-sectional views sequentially illustrating a method of forming a floating gate in a non-volatile memory device according to a third embodiment of the present invention.

Referring to FIG. 6A, a tunnel oxide layer 820 and a polycrystalline silicon layer 830 are sequentially formed on the surface of a semiconductor substrate 800 on which isolation regions 810 are formed. Next, an interlayer oxide layer and a silicon nitride layer are formed and patterned to form interlayer oxide layer patterns 840 and silicon nitride layer patterns 850. Sidewall spacers 860 are formed on the sidewalls of the interlayer oxide layer patterns 840 and the silicon nitride layer patterns 850.

Figure 6B:
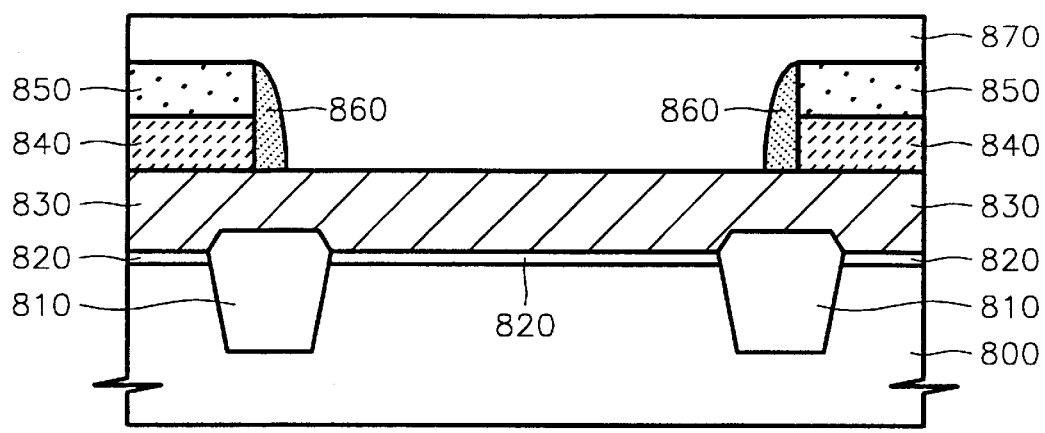

Referring to FIG. 6B, a mask layer 870 is formed on the entire surface of the resultant substrate. Preferably, the mask layer 870 is formed to a thickness of 1000 to 5000 Å by conventional techniques such as chemical vapor deposition (CVD).

Figure 6C:
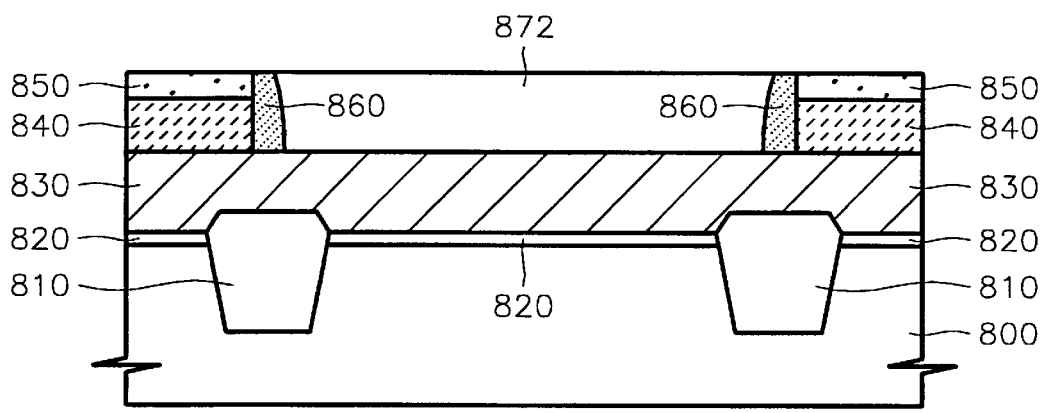

Referring to FIG. 6C, the surfaces of the mask layer 870 and the silicon nitride layer patterns 850 are planarized by conventional techniques such as chemical mechanical polishing (CMP). Thus, a mask layer pattern 872 is formed. It is preferable that CMP is performed excessively so that the sidewall spacers 860 are exposed. This facilitates subsequent processes for removing the silicon nitride layer patterns 850 and the sidewall spacers 860.

Figure 6D:
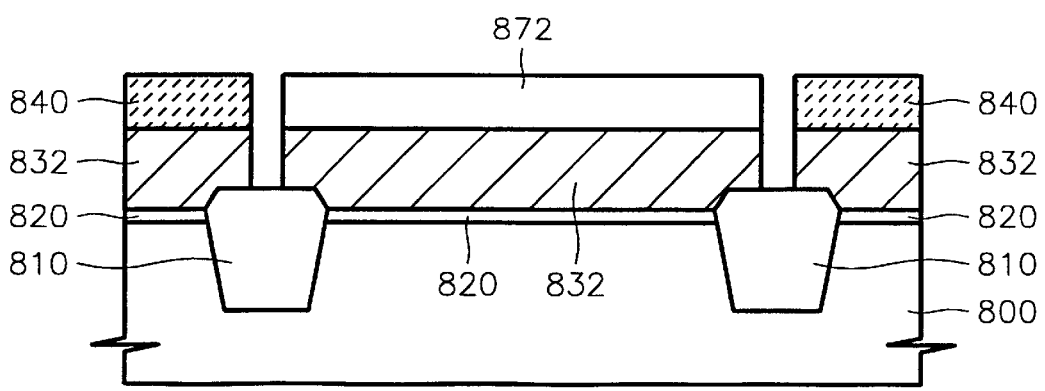

Referring to FIG. 6D, the silicon nitride layer patterns 850 and the sidewall spacers 860 are removed. Next, the polycrystalline silicon layer 830 is etched using the mask layer pattern 872 and the interlayer oxide layer patterns 840 as an etch mask. Consequently, the surfaces of the isolation regions 810 are exposed, and the polycrystalline silicon layer 830 is patterned. The mask layer pattern 872 and the interlayer oxide layer patterns 840 are removed to form floating gates 832. The subsequent process is the same as the first embodiment.

As described above, in the floating gates forming method according to the present invention, the spacing between the floating gates is determined by the width of a sidewall, so that floating gate patterns having a narrow spacing therebetween can be formed overcoming the limits of photolithography. Therefore, wider floating gates can be formed, so that the capacitance induced between the floating gate and the control gate can be increased. Also, the surfaces of the floating gates are not exposed to an etching solution containing phosphoric acid while a silicon nitride layer is etched, thus preventing damage to the surfaces of the floating gates. Thus, current leakage can be reduced.

The embodiments of the present invention can be modified into various other forms, and the scope of the present invention must not be interpreted as being restricted to the embodiments. The embodiments are provided to more completely explain the present invention to those skilled in the art. It is apparent to one of ordinary skill in the art that modifications of the described embodiment may be made without departing from the spirit and scope of the invention.

What is claimed is:

1. A method of fabricating floating gates in a semiconductor device, comprising:

sequentially forming a tunnel oxide layer, a polycrystalline silicon layer, an interlayer oxide layer, and a silicon nitride layer on a semiconductor substrate having isolation regions;

etching the silicon nitride layer, thereby forming a plurality of silicon nitride layer patterns which are separated from each other;

etching the interlayer oxide layer using the silicon nitride layer patterns as an etch mask, thereby exposing a surface of the polycrystalline silicon layer and forming a plurality of interlayer oxide layer patterns;

forming sidewall spacers on sidewalls of the silicon nitride layer patterns and the interlayer oxide layer patterns;

forming a mask layer on a region of the exposed surface of the polycrystalline silicon layer;

removing the silicon nitride layer patterns and the sidewall spacers; and etching the polycrystalline silicon layer using the interlayer oxide layer patterns and the mask layer as an etch mask, thereby exposing the isolation regions.

2. The method of claim 1, wherein the widths of the silicon nitride layer patterns are the same as the widths of the floating gates, and a spacing between adjacent silicon nitride layer patterns is greater than the widths of the silicon nitride layer patterns.

3. The method of claim 1, wherein a spacing between adjacent floating gates is determined by the widths of the sidewall spacers.

4. The method of claim 1, wherein a spacing between adjacent floating gates is 0.1 $\mu$m or less.

5. The method of claim 1, wherein the mask layer is a thermal oxide layer formed by thermally oxidizing the region of the exposed surface of the polycrystalline silicon layer.

6. The method of claim 1, wherein forming the sidewall spacers comprises:

forming a second silicon nitride layer on the semiconductor substrate on which the silicon nitride layer patterns have been formed; and anisotropically etching the silicon nitride layer.

7. The method of claim 6, wherein the second silicon nitride layer is formed to a thickness that is the same as the width of each of the sidewall spacers to be formed.

8. A method of fabricating floating gates in a semiconductor device, comprising:

sequentially forming a tunnel oxide layer, a first polycrystalline silicon layer, a lower oxide layer, a second polycrystalline silicon layer, an upper oxide layer, and a silicon nitride layer on a semiconductor substrate having isolation regions;

forming a plurality of silicon nitride layer patterns which are separated from each other, said forming including etching the silicon nitride layer;

etching the upper oxide layer using the silicon nitride layer patterns as an etch mask, thereby exposing a first surface of the second polycrystalline silicon layer and forming a plurality of upper oxide layer patterns;

forming sidewall spacers on sidewalls of the silicon nitride layer patterns and the upper oxide layer patterns;

forming a mask layer on the lower oxide layer by thermally oxidizing a region of the first exposed surface of the second polycrystalline silicon layer;

removing the silicon nitride layer patterns and the sidewall spacers;

etching a second exposed surface of the second polycrystalline silicon layer using the mask layer and the upper oxide layer patterns as an etched mask, thereby exposing a surface of the lower oxide layer;

forming lower oxide layer patterns by etching the mask layer, the upper oxide layer patterns, and the exposed surface of the lower oxide layer;

removing the second polycrystalline silicon layer;

etching the first polycrystalline silicon layer using the lower oxide layer patterns as an etch mask, thereby exposing the isolation regions; and removing the lower oxide layer patterns.

9. The method of claim 8, wherein the widths of the silicon nitride layer patterns are the same as the widths of the floating gates, and a spacing between adjacent silicon nitride layer patterns is greater than the widths of the silicon nitride layer patterns.

10. The method of claim 8, wherein a spacing between adjacent floating gates is determined by the width of each of the sidewall spacers.

11. A method of fabricating floating gates in a semiconductor device, comprising:

sequentially forming a tunnel oxide layer, a polycrystalline silicon layer, an interlayer oxide layer, and a silicon nitride layer on a semiconductor substrat having isolation regions;

forming a plurality of silicon nitride layer patterns which are separated from each other, said forming including etching the silicon nitride layer;

exposing a surface of the polycrystalline silicon layer by etching the interlayer oxide layer using the silicon nitride layer patterns as an etch mask, thereby forming a plurality of interlayer oxide layer patterns;

forming sidewall spacers on sidewalls of the silicon nitride layer patterns and the interlayer oxide layer patterns;

forming a mask layer on the entire surface of the resultant structure;

planarizing the mask layer so that the silicon nitride layer patterns are at least partially removed and the sidewall spacers are exposed;

removing the silicon nitride layer patterns and the sidewall spacers; and exposing the isolation regions by etching the polycrystalline silicon layer using the interlayer oxide layer patterns and the mask layer as an etch mask.

12. The method of claim 11, wherein the widths of the silicon nitride layer patterns are the same as the widths of the floating gates, and a spacing between adjacent silicon nitride layer patterns is greater than the widths of the silicon nitride layer patterns.

13. The method of claim 11, wherein a spacing between adjacent floating gates is substantially equal to the width of each of the sidewall spacers.

14. The method of claim 11, wherein the mask layer is an oxide layer formed by chemical vapor deposition.

15. The method of claim 11, wherein the mask layer is planarized by chemical mechanical polishing.

16. A method of fabricating floating gates in a semiconductor device, comprising:

sequentially forming a dielectric layer, a conductive layer, and an interlayer insulating layer on a semiconductor substrate with isolation regions;

forming a plurality of mask patterns that are separated from each other;

etching the interlayer insulating layer using the mask patterns, thereby exposing a surface of the conductive layer and forming a plurality of interlayer insulating layer patterns;

forming sidewall spacers on sidewalls of the mask patterns and the interlayer insulating layer patterns;

forming a mask layer on a region of the exposed surface of the conductive layer;

removing the mask patterns and the sidewall spacers; and etching the conductive layer using the interlayer insulating layer patterns and the mask layer as an etch mask, thereby exposing the isolation regions.

17. The method of claim 16, wherein the widths of the mask patterns are the same as the widths of the floating gates, and a spacing between adjacent mask patterns is greater than the widths of the mask patterns.

18. The method of claim 16, wherein a spacing between adjacent floating gates is determined by the widths of the sidewall spacers.

19. The method of claim 16, wherein the dielectric layer is formed of oxide, the interlayer insulating layer is formed of oxide, the conductive layer is formed of polycrystalline silicon, and the mask layer patterns are formed of silicon nitride.

20. The method of claim 16, wherein the mask layer is a thermal oxide layer formed by thermally oxidizing an exposed surface of the conductive layer.

* * * * *

UNITED STATES PATENT AND TRADEMARK OFFICE
CERTIFICATE OF CORRECTION

PATENT NO.    : 6,342,451 B1
DATED         : January 29, 2002
INVENTOR(S)   : Ahn It is certified that error appears in the above-identified patent and that said Letters Patent is hereby corrected as shown below:

Column 5,
Line 10, "1000 A" should read -- 1000Å --.
Lines 12 and 50, "300A" should read -- 300Å --.
Line 65, "numeral c of" should read -- numeral (c) of --.

Column 6,
Line 20, "Embodiment> A" should read -- Embodiment> [new paragraph] A --.

Column 7,
Line 21, "Åby" should read -- Å by --.

Column 9,
Line 24, "substrat" should read -- substrate --.

Signed and Sealed this

Twenty-ninth Day of October, 2002

Attest:

JAMES E. ROGAN
Attesting Officer          Director of the United States Patent and Trademark Office